United States Patent
Beffa et al.

(10) Patent No.: US 6,442,719 B1
(45) Date of Patent: *Aug. 27, 2002

(54) METHOD AND APPARATUS FOR DETECTING INTERCELL DEFECTS IN A MEMORY DEVICE

(75) Inventors: Ray Beffa; William K. Waller, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/573,450

(22) Filed: May 16, 2000

Related U.S. Application Data

(63) Continuation of application No. 08/915,313, filed on Aug. 20, 1997, now Pat. No. 6,079,037.

(51) Int. Cl.[7] .............................. G11C 29/00; G11C 7/00
(52) U.S. Cl. ...................................... 714/721; 365/201
(58) Field of Search ............................... 714/718, 719, 714/721; 365/200, 201

(56) References Cited

U.S. PATENT DOCUMENTS

| | | | |
|---|---|---|---|
| 4,670,878 A | | 6/1987 | Childers ....................... 371/21 |
| 4,757,503 A | * | 7/1988 | Hayes et al. ................. 714/718 |
| 4,800,332 A | * | 1/1989 | Hutchins ..................... 324/73.1 |
| 4,916,700 A | | 4/1990 | Ito et al. ...................... 371/21.1 |
| 5,029,131 A | | 7/1991 | Kajigaya ..................... 365/201 |
| 5,051,995 A | | 9/1991 | Tobita ......................... 371/21.1 |
| 5,199,034 A | | 3/1993 | Yeo et al. ..................... 371/21.1 |
| RE34,445 E | * | 11/1993 | Hayes et al. ................. 714/718 |
| 5,258,954 A | | 11/1993 | Furuyama .................... 365/201 |
| 5,287,312 A | | 2/1994 | Okamura et al. ............ 365/201 |
| 5,371,710 A | | 12/1994 | Ogihara .................. 365/230.01 |
| 5,373,509 A | | 12/1994 | Katsura ....................... 371/21.2 |
| 5,381,373 A | | 1/1995 | Ohsawa ....................... 365/201 |
| 5,436,911 A | | 7/1995 | Mori ........................... 371/21.1 |
| 5,559,745 A | * | 9/1996 | Banik et al. ................. 365/201 |
| 5,570,317 A | * | 10/1996 | Rosen et al. ................. 365/200 |
| 5,757,816 A | * | 5/1998 | Al-Assadi et al. ........... 714/718 |
| 6,079,037 A | * | 6/2000 | Beffa et al. .................. 714/720 |
| 6,167,541 A | * | 12/2000 | Siek et al. ................... 714/719 |

OTHER PUBLICATIONS

Arimoto et al., A 60 ns 3.3 V 16 Mb DRAM, 1989 IEEE Solid State Circuits Conference, Digest of Technical Papers, pp. 244–245.
PCComputing, Jun. 1995.

* cited by examiner

*Primary Examiner*—Albert Decady
*Assistant Examiner*—Joseph D. Torres
(74) *Attorney, Agent, or Firm*—Dorsey & Whitney LLP

(57) ABSTRACT

A method for identifying intercell defects in a memory device activates a plurality of spaced-apart rows simultaneously. Each of the rows includes cells that are written to logic states corresponding to high voltages. Cells in rows adjacent to the activated rows are written to logic states corresponding to low voltages. After the rows are activated, a testing interval passes to allow charge from cells of the activated rows to leak to adjacent cells through any stringers or other defects. In a device according to the invention, a variable voltage level circuit is incorporated in a precharge and equalization circuit to allow both inverting and non-inverting digit lines of the memory array to be set at the same voltage levels. Because the inverting and non-inverting digit lines are held at the same voltage levels, the number of word lines that can be activated for testing is increased, thereby reducing the overall time for testing. In one embodiment of the method according to the invention, the memory array is written to a checkerboard pattern and every fourth word line is activated during testing. Because every fourth word line contains cells having a high voltage and the corresponding digit lines are also at high voltages, the load on the digit lines is small. Consequently, sense amplifiers coupled to the digit lines can maintain high voltages on the digit lines to replace any charge lost due to defects.

19 Claims, 11 Drawing Sheets

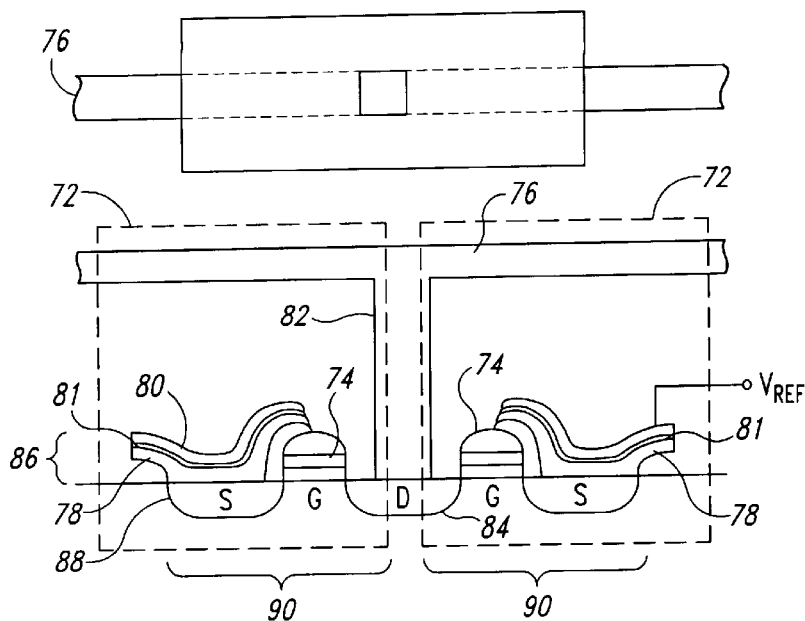
*Fig. 4*
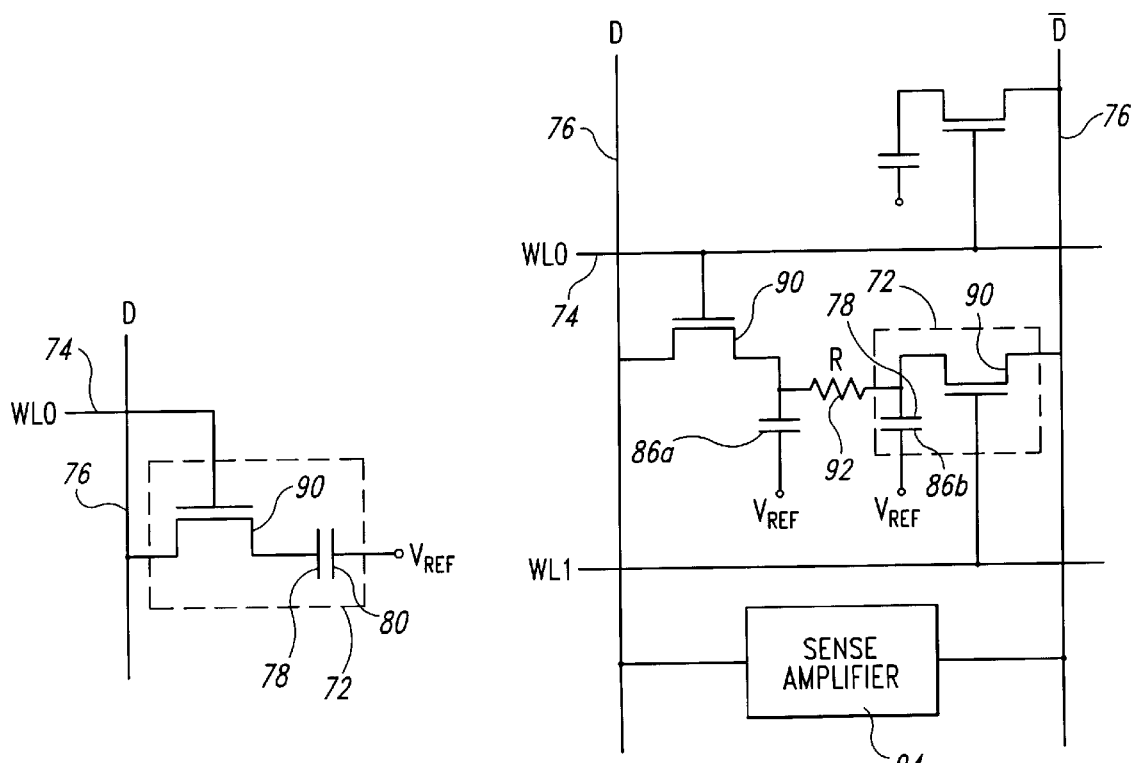
*Fig. 5*
*Fig. 6*

METHOD AND APPARATUS FOR DETECTING INTERCELL DEFECTS IN A MEMORY DEVICE

CROSS-REFERENCE TO RELATED APPLICATION

This application is a continuation of U.S. patent application Ser. No. 08/915,313, filed Aug. 20, 1997, now U.S. Pat. No. 6,079,037 filed Jun. 20, 2000.

TECHNICAL FIELD

The present invention relates to integrated circuit devices, and more particularly, to methods and structures for testing integrated memory arrays.

BACKGROUND OF THE INVENTION

Various types of defects and failures can occur during the manufacture of semiconductor devices. A "failure" occurs when a semiconductor device fails to meet specifications. A "defect" occurs when a semiconductor device has an improper circuit structure that currently presents a failure of the device, or has the potential to cause failure during the expected lifetime of the device. In a memory device for example, manufacturing errors may produce a polysilicon residue or "stringer" between a pair of adjacent memory cells. The stringer provides a current path between the adjacent cells so that a "low" voltage written to one cell lowers a "high" voltage on the adjacent cell to a high value, resulting in incorrect data being stored in the memory device.

Testing is performed on semiconductor devices to locate such defects and failures. As circuit density on semiconductor devices increases, the number of defects and failures can increase. Semiconductor manufacturers, therefore, have an increasing need to detect defects and failures in semiconductor devices.

Dynamic random access memory devices ("DRAMs") are one type of device on which such tests are performed. DRAMs typically include one or more arrays of memory cells that are each arranged in rows and columns. Word or row lines extend along each of the rows to enable all of the memory cells along the row. Bit, digit, or column lines (or pairs of lines) extend along the columns of the array to select individual memory cells along a row which data is to be read from or written to.

During testing, predetermined data or voltage values are applied to selected row and column addresses, that correspond to certain memory cells to store or "write" data in the cells. Then, voltage values are read from such memory cells to determine if the data read matches the data written to those addresses. If the read data does not match the written data, then the memory cells at the selected addresses likely contain defects, and the semiconductor devices fail the test.

A person testing the several die on the wafer can then examine a particular die by means of a microscope to determine if failures occurred from masking defects, during the deposition of certain layers, and so forth. During the initial development of a semiconductor device, and while the device is in die form, changes to masks or the fabrication process can be made to compensate for most detected failures. Once a semiconductor device is in production and packaged as a chip, redundant circuitry on the semiconductor device can be employed to replace certain failed components. Such redundant circuitry cannot replace all failed components, and therefore, some failed devices must generally be discarded.

To increase output of acceptable devices, semiconductor manufacturers try to rapidly test the devices for defects before shipping them to a vendor or user. The semiconductor devices are often tested by automated testing circuitry that applies predetermined voltages and signals to the chip, writes test patterns to the chip, and analyzes the results therefrom to detect failures in the chip.

Returning to the above-described problem of stringers between adjacent cells, the conductive path formed by such stringers may have a high resistance. The low voltage on a first cell will then take an extended period to decrease the voltage of an adjacent second cell. Therefore, such intercell defects may not be revealed by tests that read the voltage of the second cell shortly after writing voltage to the first cell. As a result, after applying a voltage to the first cell, automated testing circuitry must wait before looking for voltage changes at the adjacent cell. Typical wait times, or "testing intervals," between writing to the first cell and reading from the second cell are 48–64 msec. If such a procedure were applied sequentially to each cell in the memory array, testing of devices would take over 10 hours for every million cells. The cost of such testing would be prohibitive.

One approach to reducing the time for testing such devices is to prewrite an entire row of the memory array to logic states such that all of the cells in the first row are at a high voltage $V'_{HIGH}$ that is equal to the supply voltage $V_{CC}$. Then, an adjacent row is written to logic states such that all of the cells in the adjacent row are at low voltages $V'_{LOW}$ that are equal to a reference voltage $V_{REF}$. Then, after the testing interval, the data in the second row are read to see if any current leakage has caused changes in the cell voltages.

During the testing interval, the charge leaking from the first row's cells must be removed from cells in the second row, as will now be explained with reference to FIG. 1. As shown by the upper broken line in FIG. 1, if the leaking charge is not removed, the voltage $V'_{LOW}$ of the low voltage cell will rise as the voltage $V'_{HIGH}$ of the high voltage cell rises. The two voltages will asymptotically approach a voltage DVC2 which is approximately halfway between $V_{CC}$ and $V_{REF}$, assuming equal capacitances of the cells. As a result, the low voltage cell remains below the voltage DVC2 and the high voltage cell remains above the voltage DVC2. When the high voltage cell is coupled to its respective digit line (which is precharged to DVC2) for reading, the high voltage $V'_{HIGH}$ will pull the digit line up. A sense amplifier coupled between the digit line and an adjacent complementary digit line will read the data as unchanged, even though a stringer is present. Consequently, the defect will not be identified.

To overcome this problem, the second word line remains active over the first testing interval. Because the second word line is active, the low digit lines (kept low by the sense amplifiers) remove any charge leaking from the cells in the first row, and as represented by the solid line in FIG. 1, the voltage $V_{LOW}$ of the low voltage cell remains low. The voltage $V_{HIGH}$ of the high voltage cell falls asymptotically toward $V_{REF}$ and eventually becomes less than the voltage DVC2.

At the end of the testing interval, the second row is deactivated to isolate the cells from the digit lines and the digit lines are equilibrated. Then, data are read from the cells of the first row.

If stringers couple any of the originally activated cells of the first row to the cells in the second row, the cells in the first row will discharge to a low state. Consequently, one or more cells in the first row will contain incorrect data.

Therefore, the data read from the first row will indicate the presence or absence of intercell defects.

After data are read from the first row, data are written to all of the cells in third and fourth rows so that the cells contain opposite voltage levels. The third row is then read to set the digit line voltages. Again, the word lines remain ON for the entire testing interval to keep the high voltage cells coupled to the digit lines. After the testing interval, the third row is turned OFF and data are read from the cells in the fourth row to see if all of the data are unchanged. The above-described process is repeated until all of the rows of the array have been either written to or read from.

In the above-described process, all of the even rows (starting from row 0) are activated and all of the odd rows are read. This process test of intercell defects between only half of the adjacent row combinations. For example, the process does not identify intercell defects between the second and third rows. Therefore, the process is typically repeated by writing data to all of the odd rows and reading data from the immediately subsequent even rows.

For a memory array having 4,096 rows and using 64 msec intervals, each of the above-described passes would take at least 131.07 secs. The overall time to test all of the rows is then at least 262.14 secs, or over four minutes per memory array. While the time savings in the above approach are significant as compared to the approach of individually activating each cell in sequence, a testing time of over four minutes per part is significant. Also, this time roughly doubles when an analogous test procedure is applied to detect intercell defects between columns, assuming a 4096 by 4096 array (ie., a 16 M bit device). Moreover, the time consumption will continue to increase as the number of cells in the memory array increase.

SUMMARY OF THE INVENTION

A method and structure for identifying intercell defects in a memory array raises a plurality of cells along a first digit line to a first voltage and couples a plurality of cells along a complementary digit line to a second voltage. A plurality of word lines are then activated to sustain the voltages of the cells along the first digit line during a testing interval. At the end of the testing interval, data are read from the cells along the second digit line to see if any of the voltages have changed due to leakage through an intercell defect.

In one embodiment of the invention, the memory includes a memory array that is initially written to a checkerboard pattern. Then, a first word line is activated to couple cells in a first row to respective digit lines. Next, sense amplifiers are activated to sustain the voltages of the digit lines while selected additional word lines are activated. In one embodiment, every other word line is activated. In another embodiment, every fourth word line is activated. The word lines remain active over the entire testing interval so that the sense amplifiers can replace charge that leaks from any of the cells. After a selected testing interval the word lines are deactivated, the digit lines are equilibrated and data are read from cells of inactivated rows to see if any of the data have changed.

One embodiment according to the invention includes a biasing circuit that can selectively drive all of the digit lines to a low voltage. Because both the digit lines D, $\overline{D}$ in each complementary pair are at a high voltage, cells in the original checkerboard pattern are not pulled low when the corresponding word lines are activated.

One embodiment of the biasing circuit includes an input logic circuit that receives three logic signals and outputs three control voltages in response. The control voltages drive gates of respective transistors, each coupled to a common node in a precharge circuit. The transistors respond to the control voltages by providing high voltage, precharge voltage or ground to the common node. The precharge circuit then couples the common node to the digit lines to set the digit line voltages.

BRIEF DESCRIPTION OF THE DRAWINGS

FIG. 4 is a side cross-sectional and top plan view of an integrated cell pair.

FIG. 5 is a schematic of an individual cell of the device of FIG. 2.

FIG. 6 is a schematic of two adjacent cells with an equivalent resistance representing a defect extending between the two cells.

DETAILED DESCRIPTION OF THE INVENTION

Figure 2:
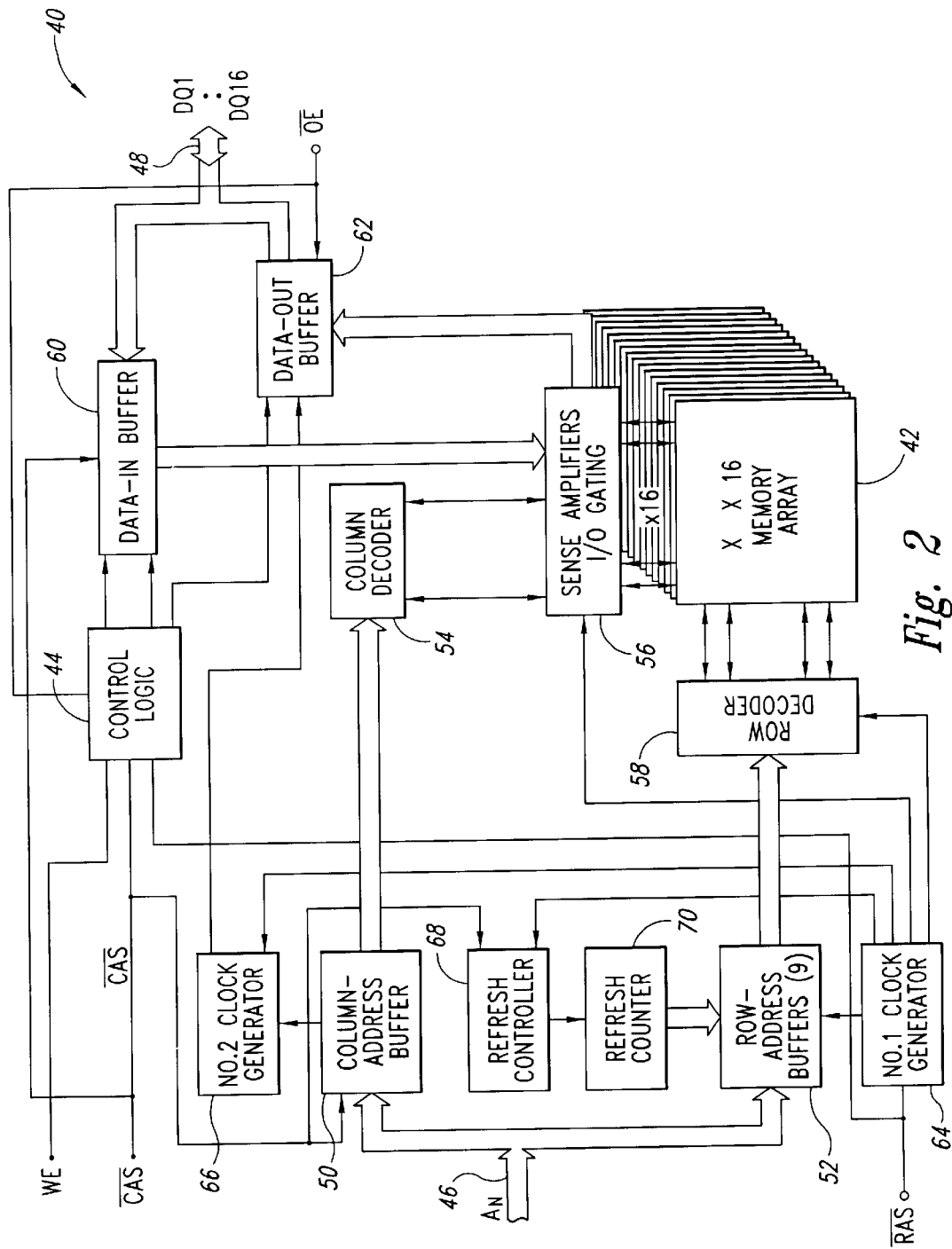
FIG. 2 is a block diagram of a conventional integrated memory device.

As shown in FIG. 2, a memory device 40 includes as its central storage element a memory array 42. The memory device 40 may be a conventional memory device tested according to the inventive method or may include test condition circuit 122 as described below with reference to FIG. 10. In either case, the memory device 40 operates under control of a logic controller 44 that receives command signals that control reading from and writing to the memory device 40. Among the command signals are a write enable signal WE, a column address strobe signal $\overline{CAS}$, a row address strobe signal $\overline{RAS}$ and an output enable signal $\overline{OE}$. The overbars for the strobe signals $\overline{CAS}$ and $\overline{RAS}$ and output enable signal $\overline{OE}$ indicate that these signals are low-true signals, i.e., the strobe signals $\overline{CAS}$, $\overline{RAS}$ and output enable signal $\overline{OE}$ go to a low logic level when true.

In addition to the command signals, the memory device 40 also receives addresses $A_N$ from an address bus 46 and receives and outputs data on a data bus 48. The received addresses may be row or column addresses. If an address $A_N$ is a column address, the address is stored in a column address buffer 50. If the address is a row address, the address is stored in a row address buffer 52.

Addresses stored in the column address buffer 50 are forwarded to a column decoder 54 that decodes the addresses and provides the decoded addresses to an I/O interface 56. The I/O interface 56 includes I/O elements such as sense amplifiers, precharge and equilibration circuitry, and input and output gating, as will be discussed in greater detail below. The I/O interface 56 allows the logic controller 44 to control reading from or writing to the memory array 42 in response to the command signals WE, $\overline{CAS}$, $\overline{RAS}$, and $\overline{OE}$.

If the address $A_N$ received at the address bus 46 is a row address, the row address buffer 52, under control of the logic controller 44, transmits the row address to a row decoder 58. The row decoder 58 decodes the row address and activates a corresponding row of the memory array 42 in response.

For write operations, data are received at the data bus 48 and stored in an input data buffer 60. When the logic controller 44 determines that the I/O interface 56 is available, the logic controller 44 activates the input data buffer 60 to transfer the input data to the I/O interface 56. As will be discussed below, the I/O interface 56 responds to the decoded column address from the column decoder 54 and the input data from the input data buffer 60 to write data to the corresponding locations in the memory array 42.

If the logic controller 44 determines that an operation is a read operation, the I/O interface 56 reads data from the location identified by the decoded column address and transfers the read data to an output data buffer 62. In response to the output enable command $\overline{OE}$, the output data buffer 62 makes the output data available at the data bus 48.

In addition to the above-described elements, the memory device 40 also includes conventional clock generators 64, 66, a refresh controller 68, and a refresh counter 70 that control internal timing of the memory device 40 and refreshing of data in the memory array 42.

Figure 3:
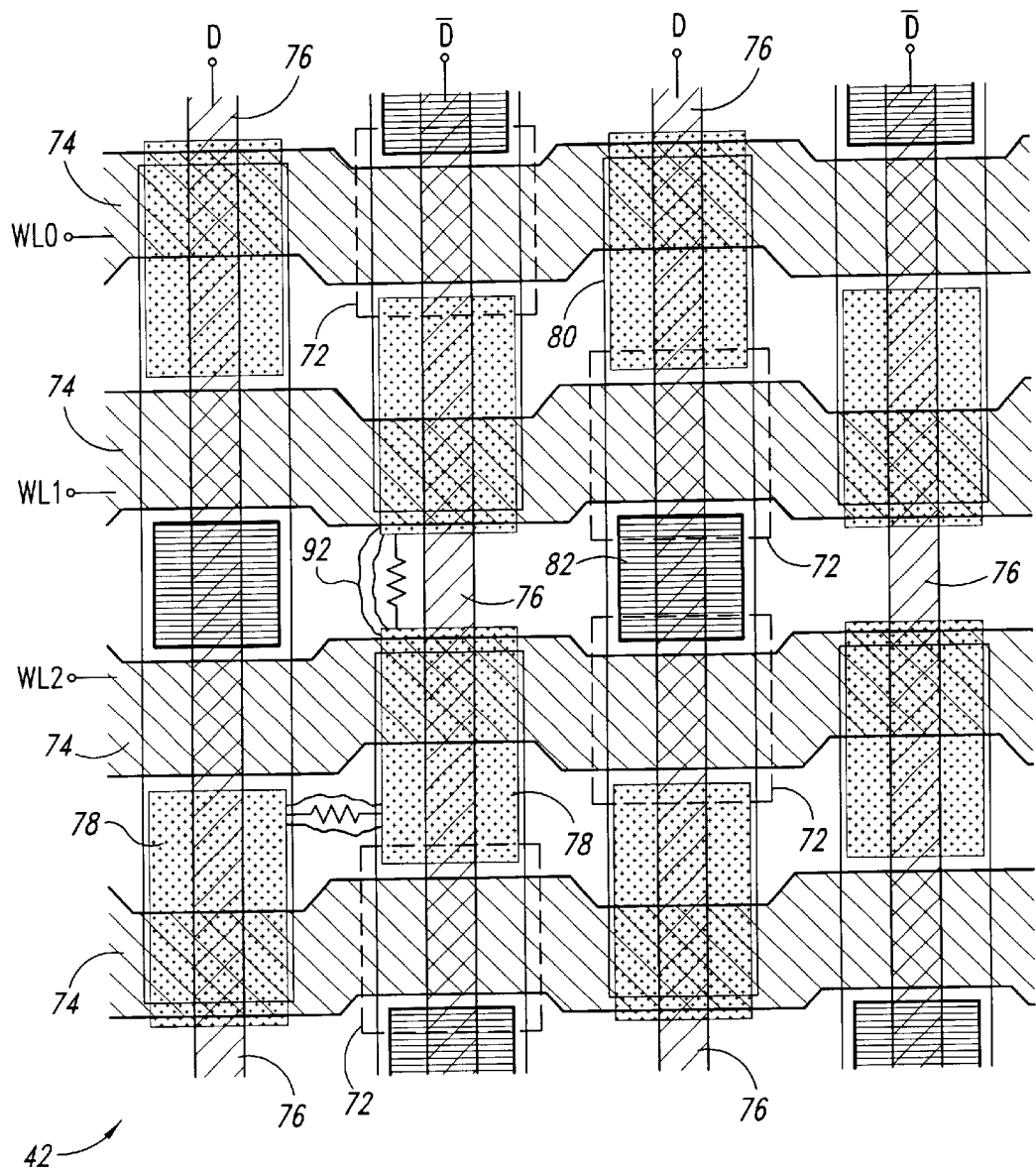
FIG. 3 is a top plan view of a section of a memory array within the device of FIG. 2 showing intersecting row and column lines and corresponding active areas defining cells of the memory array.

Turning now to the detailed view of FIG. 3, the memory array 42 is formed in a silicon substrate by row or "word" lines 74, column or "digit" lines 76, and integrated cells 72. Alternating ones of the digit lines 76 are inverse digit lines 76. That is, the inverse digit lines 76 correspond to a low-true digit signal $\overline{D}$, while the non-inverted digit lines 76 correspond to high-true digit signals D. The individual cells 72 are located at each intersection of a respective word line 74 and digit line 76.

As can be seen in the cross-sectional view of FIG. 4, each of the cells 72 includes a respective storage capacitor 86 formed from a storage plate 78 and a reference plate 80 separated from each other by a dielectric layer 81. Each of the cells 72 also includes a switching transistor 90 coupled between the storage capacitor 86 and a corresponding digit line 76. A conductive via 82 couples each digit line 76 to a drain region 84 that forms the drains of two adjacent cells 72. The source of the switching transistor 90 is coupled directly to the storage plate 78 and the gate of the switching transistor 90 is coupled to the corresponding word line 74. As shown in FIG. 4, the storage plate 78 is formed directly atop the source 88 of the integrated cell's transistor 90. However, a variety of other plate structures, such as "T-shaped" plates may be used.

The equivalent circuit of the left uppermost cell is shown in FIG. 5 where the gate of the switching transistor 90 is controlled by a first word signal WL0 and the reference plate 80 is coupled to a reference voltage $V_{REF}$. In normal operation, when the first word line signal WL0 is high, the switching transistor 90 is ON, coupling the storage plate 78 to the digit line 76. The storage plate 78 is thus charged or discharged through the switching transistor 90 until the voltage of the storage plate 78 equals the voltage of the digit line 76. If a "1" is to be written to the cell 72, the digit line 76 is driven with a high digit signal D to charge the storage plate 78 to a high voltage. If a "0" is to be written to the cell 72, the digit line 76 is driven by a low digit signal D to pull the voltage of the storage plate 78 low.

Returning to FIG. 3, one possible defect which can occur in the structure of FIG. 3 is a stringer 92. Stringers are typically conductive regions that extend between adjacent storage plates 78 forming a resistive path therebetween. Usually, stringers are the result of incomplete removal of the storage plate conductor during patterning of the storage plates 78.

As shown in the equivalent circuit of FIG. 6, the stringer 92 forms a resistive path having a resistance R between the storage plates 78 in adjacent rows. A failure due to the stringer 92 may occur when the cells 72 in adjacent rows are written to the same state, e.g., a "1" and a "0," respectively, so that different voltages are stored on the capacitors 86a and 86b. . More specifically, if a "1" is written to the left cell 72, the storage plate 78 of the left cell stores a high voltage, as described above. If a "1" is written to the right cell 72, the storage plate 78 of the right cell 72 stores a low voltage. The above discussion assumes that adjacent cells are coupled to complementary digit lines D, $\overline{D}$. One skilled in the art will recognize that to produce opposite voltages on the capacitors 86a, 86b, the specific data written to each of the cells 72 may be of opposite logic states for memory structures where adjacent cells are coupled to the same digit line D or $\overline{D}$. The voltage difference between the two storage plates 78 causes current to flow through the stringer 92 until the voltages of the storage plates 78 are equal.

Figure 1:
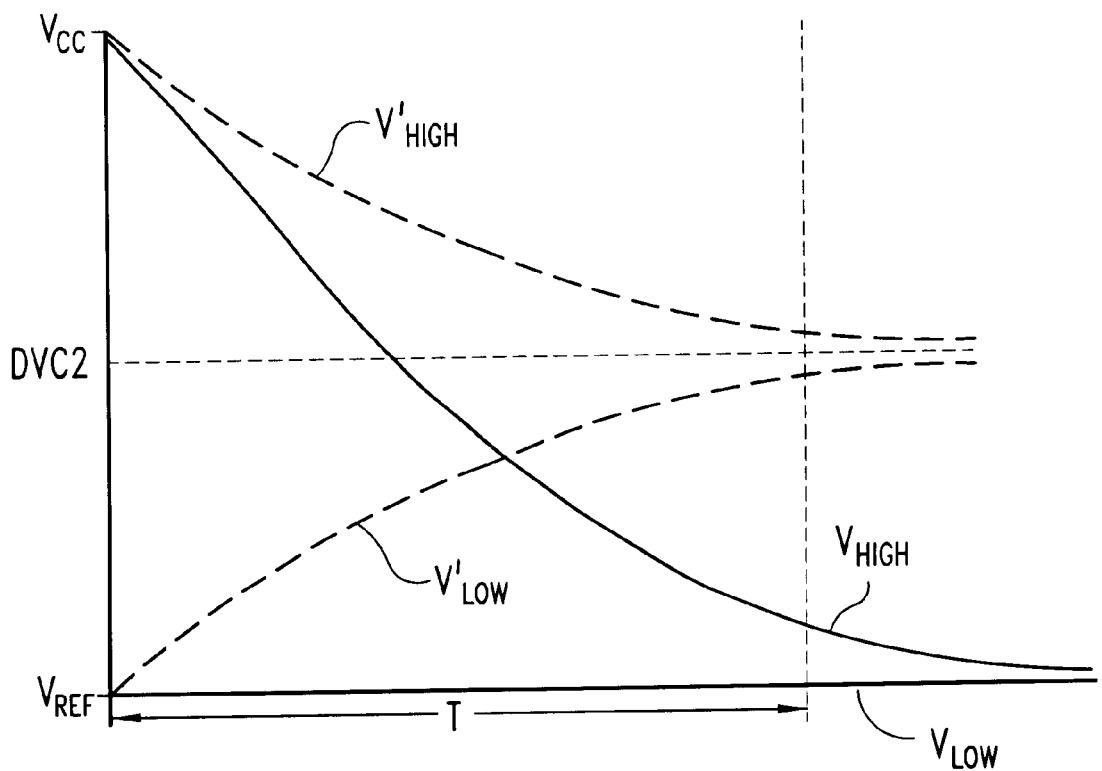
FIG. 1 is a signal diagram showing two sets of curves representing voltages on two adjacent cells where the solid lines show voltages when a low cell voltage is sustained and where the broken lines show voltages where the low cell voltage is allowed to rise.

The storage plate voltages do not equalize immediately. Instead, charge transfers according to the RC time constant of the stringer resistance R and the capacitances of the storage capacitors 86 as shown in FIG. 1. Typically, the time for equalization of the voltages is much less than 64 msec. Therefore, testing for such stringers over a 64 msec period is suitable for the tests described below.

To test coupling between adjacent cells, data corresponding to the low voltage $V_{REF}$ is written to a first of the cells 72 and data corresponding to the high voltage $V_{CC}$ is written to the adjacent cell. Then, the second word line WL1 is pulled low to turn OFF the right transistor 90, thereby isolating the capacitor 86b from the inverted digit signal $\overline{D}$.

Next, the first word line signal WL0 is set high to turn ON the left transistor 90 thereby coupling the left storage plate 78 to the digit line 76. A sense amplifier 94 sets the digit signal D low and the complementary digit signal $\overline{D}$ high in response. Unlike normal reading, the first word line signal WL0 remains high long after the sense amplifier 94 sets the digit line voltages. This allows the digit line 76 to continuously discharge the left capacitor 86, thereby removing any charge that leaks through the stringer 92 from the right capacitor 86, as described above with reference to FIG. 1.

After approximately 64 msec, the first word line WL0 returns low to turn OFF the left transistor 90. Then, the digit lines 76 are equilibrated, and the word line WL1 is set high to read data from the right cell 72. The data are output to the output data buffer 62 through the I/O interface 56 (FIG. 2). If the output data from the right cell 72 is a "0," a defect (i.e., a stringer) is identified. As noted above, the above operation takes about 64 msec. Therefore, if each cell pair were to be tested separately, the testing period would be prohibitively long.

To reduce the overall testing time, several cell pairs are tested simultaneously. One approach to simultaneously testing more than one adjacent cell will now be described with reference to FIG. 7, where the reference plates 80 are removed to reveal the active areas of the cells 72 and where the word lines 74 and digit lines 76 are represented as narrow lines for clarity of presentation. Each of the cells 72 also includes two index numbers in an upper corner indicating the relative location of the cell 72 in the matrix, where the first index number indicates the corresponding digit line 76 and the second number represents the corresponding word line 74 (each starting at "0"). For example, the left uppermost cell is coupled to the first digit line 76 and the first word line 74. Therefore, the left uppermost cell is the 0,0 cell 72.

Figure 7:
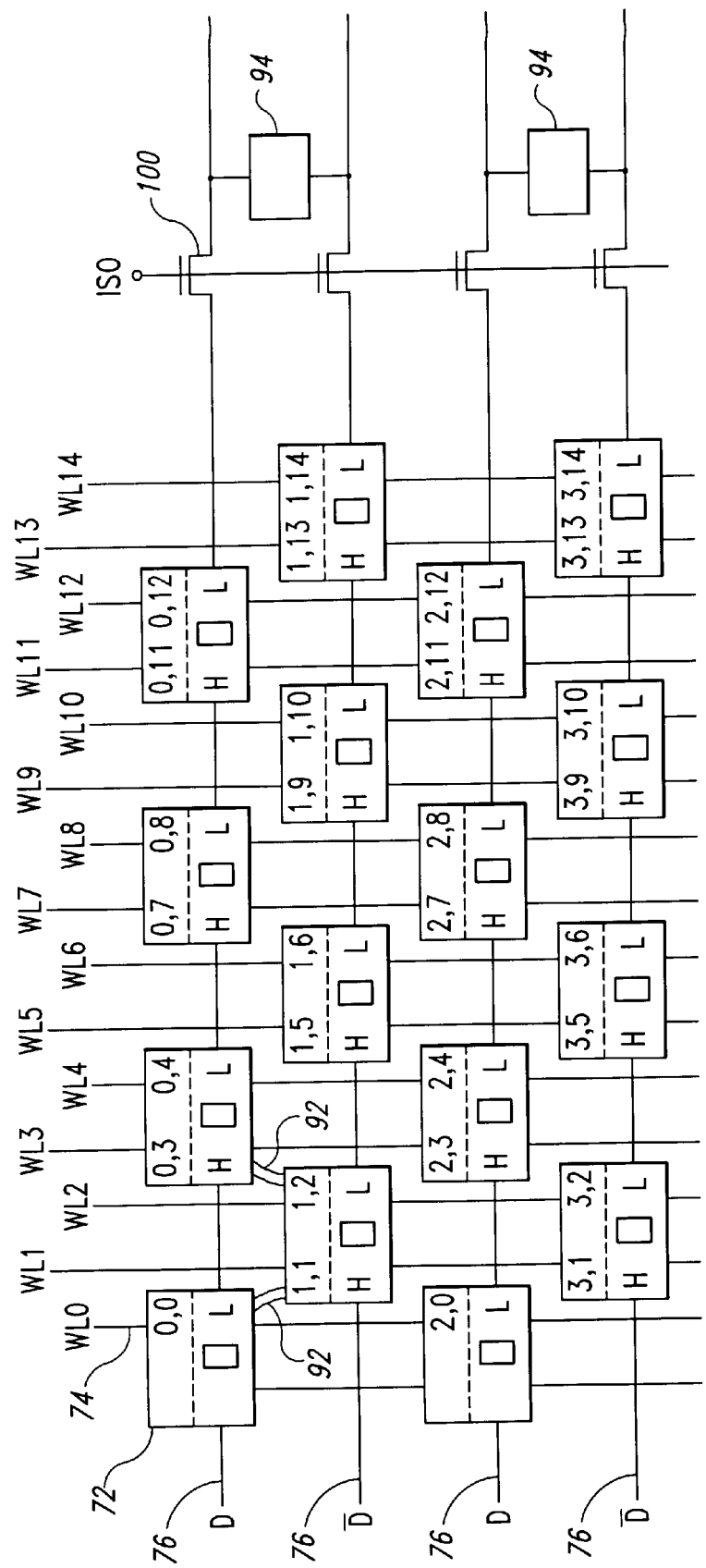
FIG. 7 is a diagrammatic representation of voltages written to the memory array of FIG. 2 showing voltages of opposite states written to adjacent rows.
Figure 8:
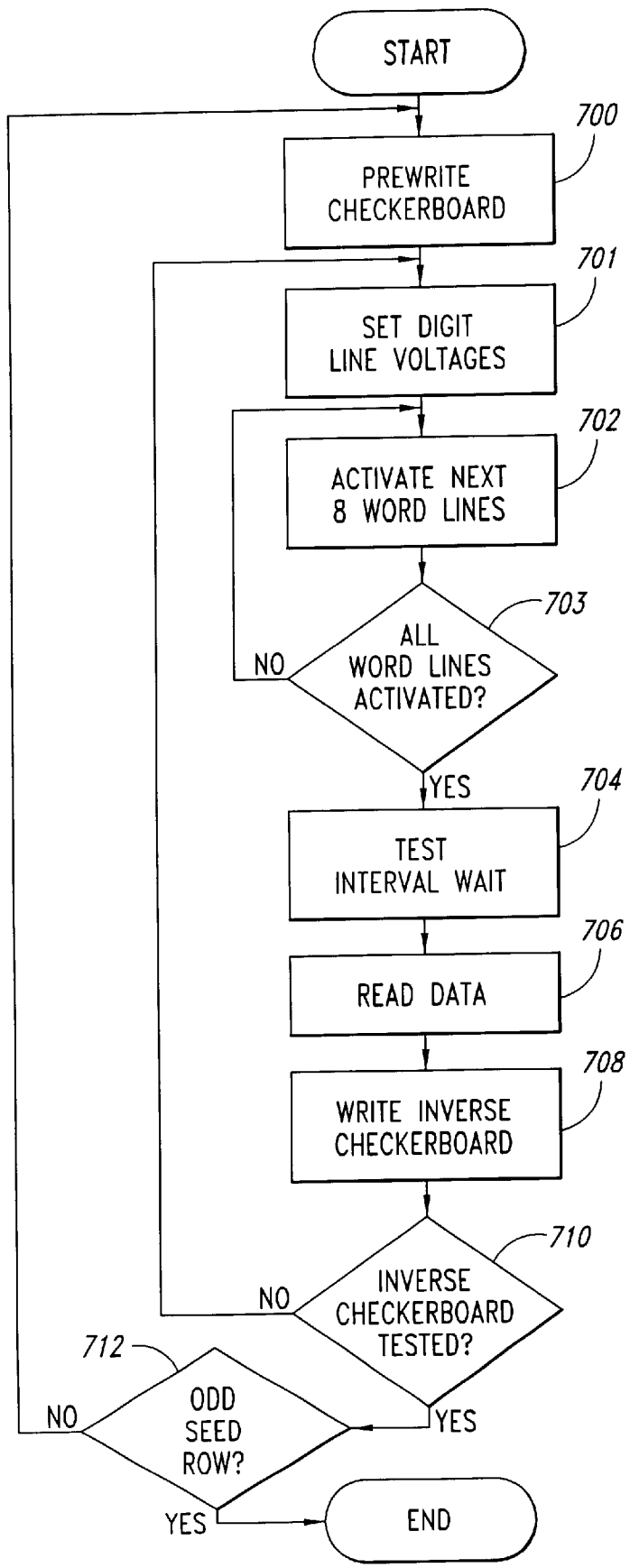
FIG. 8 is a flowchart presenting a method of testing intercell defects in the array of FIG. 7 according to one embodiment of the invention.

As shown in FIG. 7 and presented in step 700 of FIG. 8, to initiate testing, the memory array 42 is prewritten to a "checkerboard" pattern. In a checkerboard pattern, the cells 72 of the memory array 42 are written in an alternating pattern of high and low voltages, such that each cell 72 of first voltage level (e.g., $V_{CC}$) is surrounded by cells 72 of a complementary voltage level (e.g., $V_{REF}$) as represented by "H" and "L" in FIG. 7. For example, the [1,6] cell contains $V_{REF}$ and is surrounded by the [1,5], [0,7], [1,9], [2,7] cells that each contain $V_{CC}$.

In step 701, after the data are written to the array 42, the digit lines 76 are equilibrated and the first two word line signals WL0, WL1 are set high with the sense amplifiers 94 coupled to their respective sets of digit lines 76 through respective isolation transistors 100. The voltages of the cells 72 coupled to the first and second word lines 74 are read by the sense amplifiers 94, thereby driving the non-inverted digit lines 76 fully low and the inverted digit lines 76 fully high.

Next, in step 702, subsequent even word lines 74 are activated in groups of eight with a short recovery period after activation of each group. The cells 72 coupled to every fourth word line 74 (WL0, WL4, WL8, etc.) are pulled low by the non-inverted digit lines 76 which are driven in turn by the sense amplifiers 94. The cells 72 on these lines do not significantly load the non-inverted digit lines 76 and sense amplifiers 94 because both the cells 72 and the non-inverted digit lines 76 are already low. A check is made at step 703 to determine if all of the word lines have been activated. If not, the process returns to step 702 until all of the word lines have been activated.

The cells 72 coupled to the remaining even word lines 74 (WL2, WL6, WL10, etc.) are pulled high by the inverted digit lines 76 as driven by the sense amplifiers 94. Pulling these cells 72 high loads the sense amplifiers 94. However, the load of each separate group of cells is insufficient to cause the sense amplifiers 94 to invert, because only four cells 72 (half of the eight activated word lines 74) are pulled up by each inverted digit line 76. The recovery period allows time for the sense amplifiers 94 to charge the digit lines 76 and correct any voltage rises due to loading.

Once all of the word lines 76 (i.e., all groups) have been activated, the even word line signals remain high for a testing period of approximately 64 msec, in step 704, to allow charge to bleed through any stringers 92 from the high cells 72 to their adjacent low cells 72. At the end of the testing period in step 706, the data are read from the cells 72 of the odd word lines 74. If any of the data have changed, an intercell defect is identified.

One skilled in the art will recognize that not all defects may be identified in this portion of the testing. In FIG. 7, for example, the stringer 92 between the [1,2] cell and the [0,3] cell will not be identified, because the [1,2] cell is pulled high in step 702 and thus will not pull the [0,3] cell low in step 704.

After the data are read from the cells 72 of the odd word lines 74, an "inverse checkerboard" is written to the array 42, in step 708. The inverse checkerboard is the inverse pattern of the original checkerboard. That is, all of the cells 72 that were $V_{CC}$ in the original checkerboard become $V_{REF}$ and all of the cells 72 that were $V_{REF}$ in the original checkerboard become $V_{CC}$.

The second even word line 74 (WL2) is then activated in step 701 to set the sense amplifiers 94 so that the inverted digit lines 76 are low while the non-inverted digit lines 76 are high. The remaining even word lines 74 are then activated so that every fourth word line 74 includes cells 72 that are low and are coupled to low inverted digit lines 76. After the testing period, data are read from the cells 72 in the odd rows 76 to see if any of the data have changed.

A check is made at step 710 to determine if all of the even rows have been tested. If so, a check is made at step 712 to determine if the test was performed with an odd seed row. After the even row test, this determination that will be negative so that the above test procedure is repeated starting with the first odd row because the above procedure only identifies defects between even rows (row 0, 2, 4, etc.) and the odd rows (1, 3, 5, etc.) to their immediate right. The above test thus does not identify intercell defects between odd rows and their immediately adjacent neighbors to the right. For example, the above procedure does not identify defects between the second row (row 1) and the third row (row 2). When the above procedure is repeated starting with the first odd row, these defects will be tested. After the test has been completed using the odd that rows, the procedure will branch from step 712 to the end.

The above-described procedure involves four testing periods of 64 msec each. Thus, the total of the testing periods is 256 msec as opposed to 262 sec for the approach described previously. Of course, one skilled in the art will recognize that the actual time savings for the overall testing procedure will vary depending upon the number of cells 72 tested, the time required to write data to the cells 72, and the setup time to set all of the digit lines 76 to the appropriate voltages.

Figure 9:
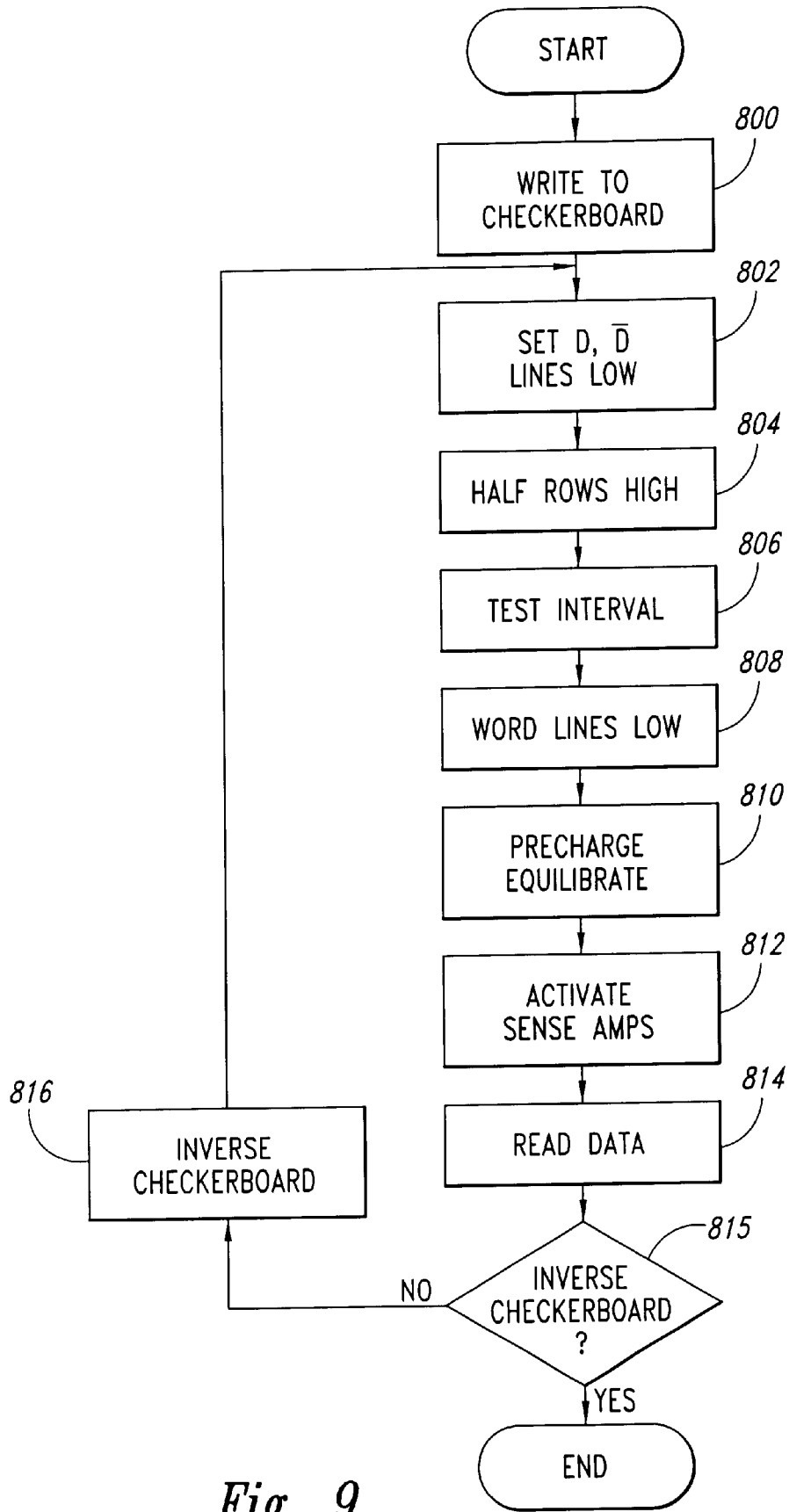
FIG. 9 is a flowchart presenting a method of testing intercell defects in the array of FIG. 7 according to another embodiment of the invention where inverting and non-inverting digit lines are both held low.
Figure 10:
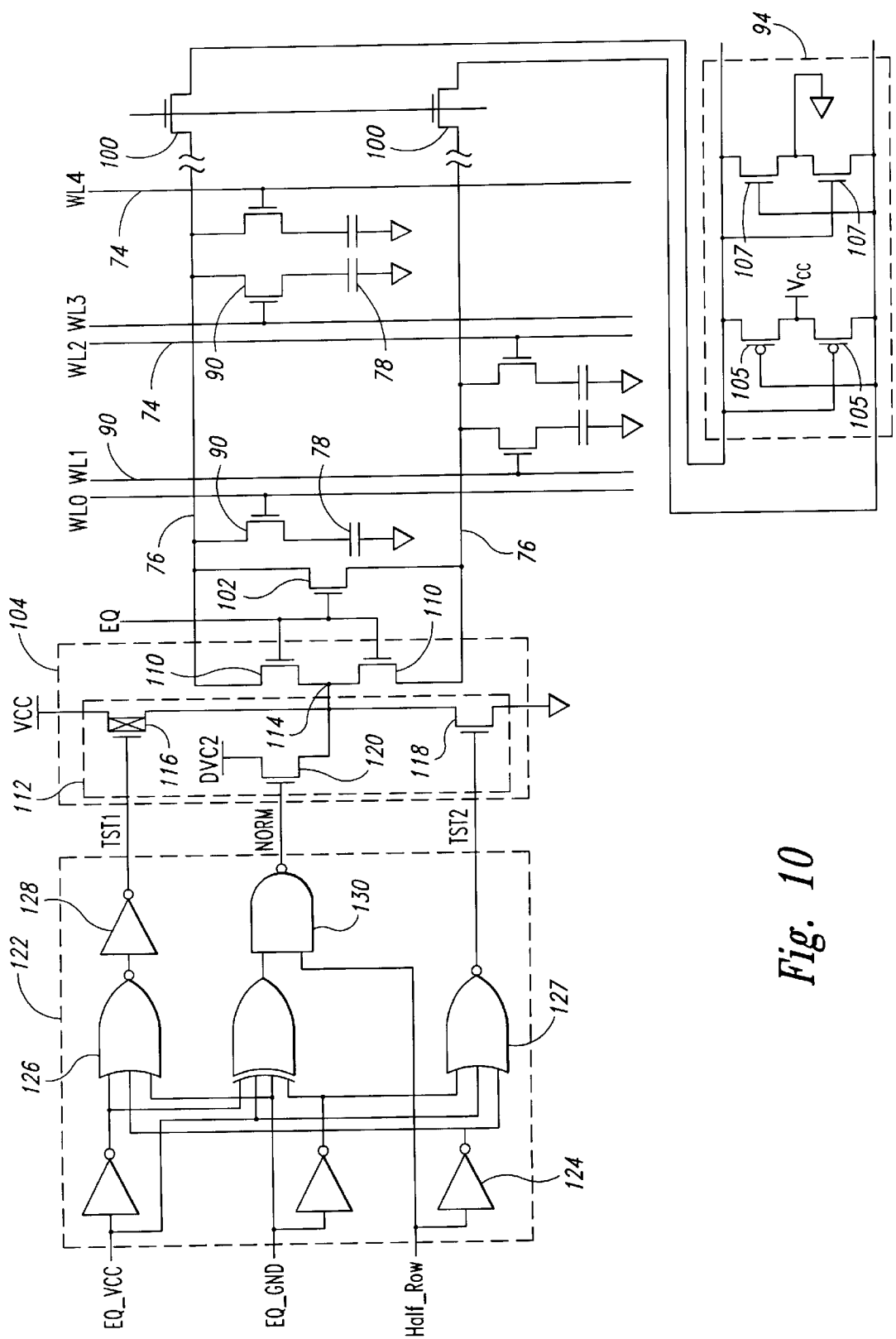
FIG. 10 is a schematic of circuitry for selectively setting digit line voltages in a memory array for the method of FIG. 9.
Figure 11:
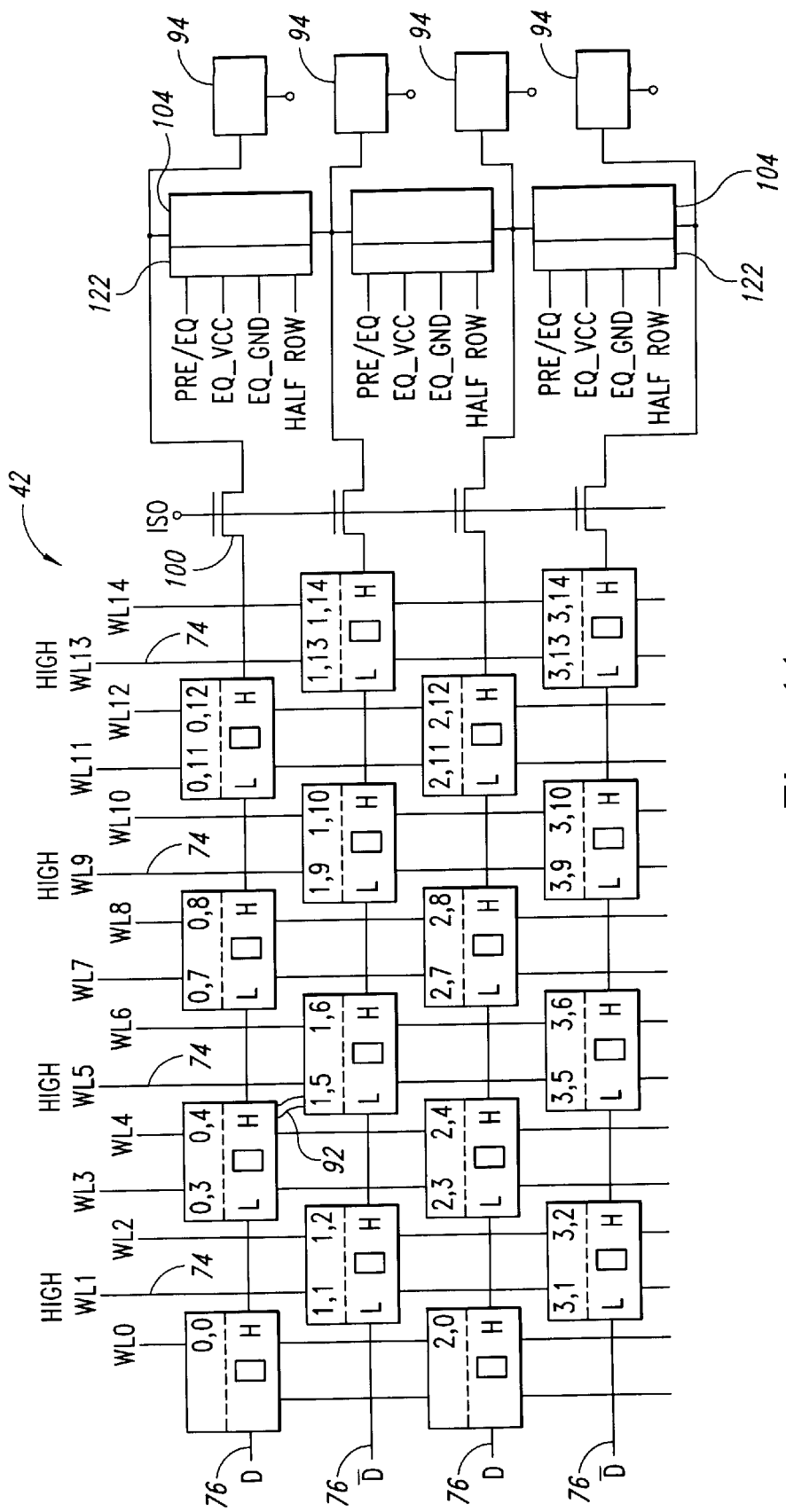
FIG. 11 is a diagrammatic representation of voltages written to a memory array including the circuitry of FIG. 10.

The flowchart of FIG. 9, schematic of FIG. 10, and diagram of FIG. 11 present another approach in which the total testing period time is reduced even further where the circuit of FIG. 10 implements this approach with circuitry not found in FIG. 6. As before, testing begins by writing a checkerboard pattern to the array 42, in step 800. In step 802, after the checkerboard is written, all of the digit lines 76 (both inverted $\overline{D}$ and non-inverted D) are tied to a low voltage in a manner which will be described below with respect to FIGS. 10 and 11. Then, in step 804, all of the even word lines 74 are activated by setting the even word line signals WL0, WL2, WL4, etc., high. The activated word lines 74 tie all of the cells 72 in the even rows to the respective digit lines 76 to ensure that any leakage into cells 72 in even rows is removed, thereby maintaining the low cell voltages. The even word lines 74 are left activated for a test interval of 64 msec to allow leakage through any stringers 92, in step 806. Then, at the end of the 64 msec test interval, the digit lines 76 are isolated from the low voltage source in step 808 by deactivating all of the word lines. The digit lines 76 are then precharged and equilibrated to DVC2, in step 810, to prepare for reading. Next, in step 812, the sense amplifiers 94 are coupled to the digit lines 76 by the isolation transistors 100 and data is read from each of the cells 72 coupled to each of the odd word lines 74, in step 814. Once all of the data have been read from the cells 72 along the odd word lines 74, the inverse checkerboard pattern is written in steps 815, 816 and the above-described procedure is repeated by setting all of the digit lines 76 low, activating the odd word lines, waiting for the test period, and reading data from the cells 72 coupled to the even word lines 74. One skilled in the art will recognize that the above-described procedure involves only two testing intervals of 64 msec. Consequently, the overall waiting time is reduced to 128 msec, as compared to 256 msec in the embodiment of FIG. 8.

As noted above, the test procedure of FIG. 9 includes setting all of the digit lines 76 to a low voltage. Conventional memory devices typically do not include circuitry designed to simultaneously set both digit lines D, $\overline{D}$ in a complementary pair to a low voltage. Instead, typical memory devices include precharging and equilibration circuits that set the inverting and non-inverting digit lines to the precharge voltage DVC2 which is half of $V_{CC}$.

FIGS. 10 and 11 show one embodiment of the invention where the inverting and non-inverting digit lines 76 can be driven simultaneously to either a high voltage $V_{CC}$, the precharge voltage DVC2, or a reference voltage GND. In the device 40 of FIG. 10, the I/O interface 56 includes the sense amplifiers 94, the isolation transistors 100, an equilibration circuit 102, and a line driving circuit 104. The sense amplifiers 94 are conventional sense amplifiers including a pair of PMOS sense transistors 105 and a pair of NMOS sense transistors 107 cross coupled between the digit lines 76 where the p-sense transistors 105 are driven by the voltage $V_{CC}$ and the n-sense transistors 107 are driven by a reference voltage GND. The isolation transistors 100 are also conventional NMOS transistors driven by an isolation signal ISO, to selectively isolate or couple the digit lines 76, from or to, their respective sense amplifiers 94. The equilibration circuit 102 is formed from an NMOS transistor coupled between the inverting and non-inverting digit lines 76 and driven by an equilibration signal EQ to equilibrate voltage between adjacent digit lines 76.

The line driving circuit 104 includes a pair of NMOS precharge transistors 110 serially coupled between the digit lines 76 and having their gates driven by the equilibration signal EQ. Unlike a conventional precharge circuit, the line driving circuit 104 also includes a variable bias circuit 112 coupled to a node 114 that joins the precharge transistors 110. The variable voltage circuit 112 includes three NMOS coupling transistors 116, 118, 120 coupled between the node 114 and respective voltage sources. The first coupling transistor 116 couples the node 114 to the high voltage $V_{CC}$ in response to a first test signal TST1. The second coupling transistor 118 couples the node 114 to a reference voltage GND in response to a second test signal TST2. The third coupling transistor 120 couples the node 114 to the precharge voltage DVC2 in response to a normal operation signal NORM. Thus, the node 114 can be selectively driven at the high voltage $V_{CC}$, reference voltage GND, or precharge voltage DVC2 depending on the states of the signals TST1, TST2, and NORM. Establishment of the signals TST1, TST2, and NORM will be described below.

During precharging, the test signals TST1, TST2 are both low so that the node 114 is isolated from the high voltage $V_{CC}$ and the reference voltage GND. The equilibration signal EQ is high so that the equilibration circuit 102 couples the digit lines 76 to the complementary digit lines 76 to ensure that the digit lines are at equal voltages. Also, in response to the equilibration signal EQ, the precharge transistors 110 couple the node 114 to both of the digit lines 76. Consequently, both digit lines 76 in the complementary pair are driven to the voltage of the node 114.

During step 802 above, the second test signal TST2 is low when the equilibration signal EQ is high so that the node 114 is coupled to the reference voltage GND. At the same time, the first test signal TST1 and normal signal NORM are both low so that the node 114 is isolated from the precharge voltage DVC2 and the high voltage $V_{CC}$. Therefore, both the inverting and non-inverting column lines 76 are driven to the reference voltage GND during step 802.

During normal operation, the test signals TST1, TST2 are low and the normal signal NORM is high. Consequently, the node 114 receives the precharge voltage DVC2. The equilibration signal EQ then precharges the digit lines to the precharge voltage DVC2.

A test condition circuit 122 provides the test and normal signals TST1, TST2, NORM in response to three logic signals Half_Row, EQ_VCC, EQ_GND from the logic controller 44 (FIG. 2). When the half-row signal Half_Row is low, an inverter 124 provides a "1" to each of a pair of NOR gates 126, 127. In response, the upper NOR gate 126 provides a "0" to an inverter 128 and the inverter 128 pulls the gate of the coupling transistor 116 high, turning OFF the coupling transistor 116. The OFF coupling transistor 116 isolates the node 114 from the high voltage $V_{CC}$. The lower NOR gate 127 provides a low voltage to the coupling transistor 118, turning OFF the coupling transistor 118 and isolating the node 114 from the reference voltage GND.

The low half-row signal Half_Row directly drives a NAND gate 130 causing the NAND gate to output a high voltage. The high voltage turns ON the coupling transistor 120, thereby providing the precharge voltage DVC2 to the node 114. Thus, when the half-row signal Half_Row is low, the node 114 receives the precharge voltage DVC2.

When the half-row signal Half_Row is high, the equalization signals EQ_VCC, EQ_GND control the node voltage. If the upper equalization signal EQ_VCC is high and the lower equalization EQ_GND is low, the upper NOR gate 126 receives all "0s" and the coupling transistor 116 is ON. At the same time, the coupling transistor 118 is OFF, so the node voltage equals the high voltage $V_{CC}$. Conversely, the node voltage will equal the reference voltage when the upper equalization signal EQ_VCC is low and the lower equalization signal EQ_GND is high.

Figure 12:
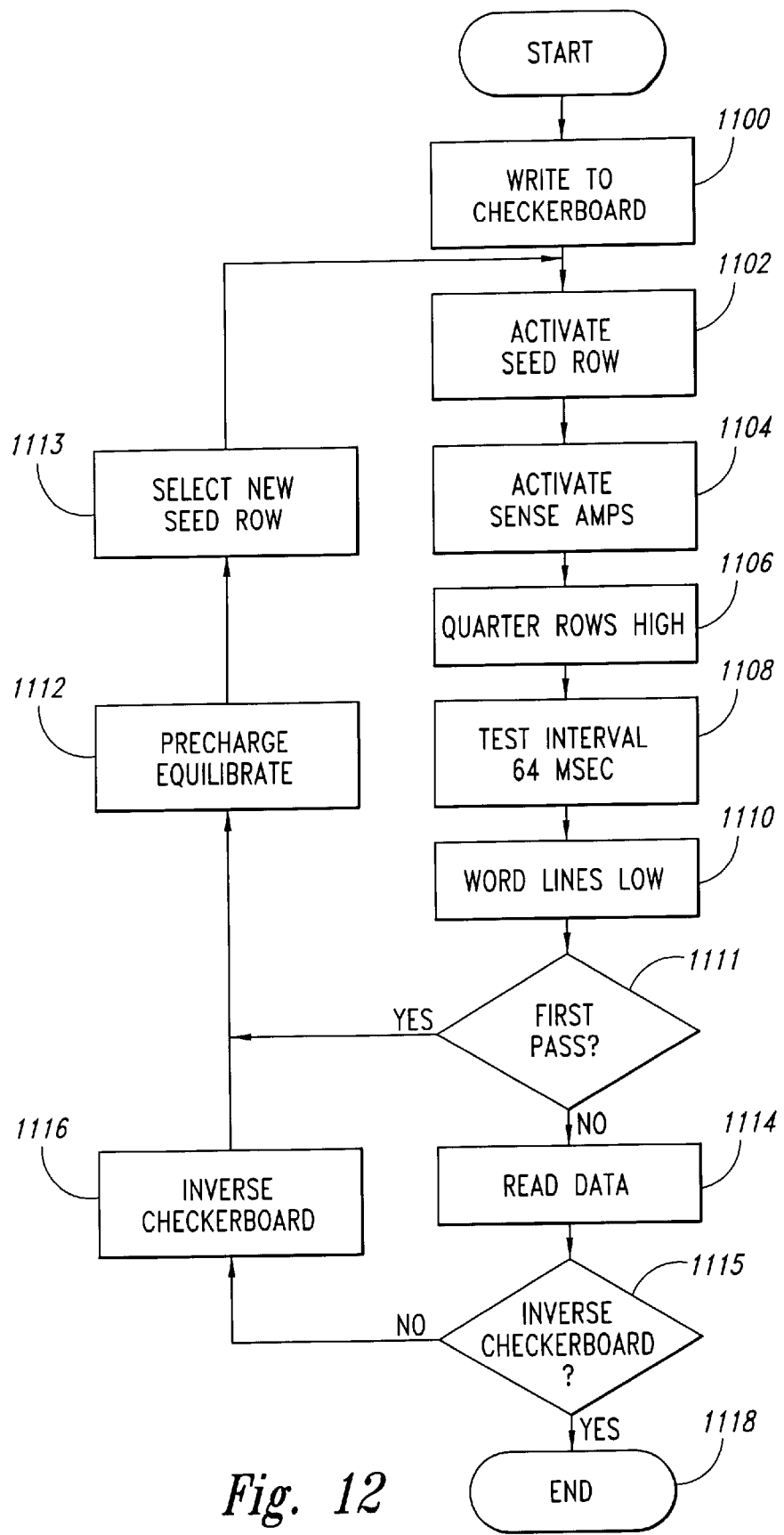
FIG. 12 is a flowchart presenting a method of testing intercell defects in the array of FIG. 7 according to another embodiment of the invention where a fourth of the word lines are tested during each pass.

In another embodiment of the invention described in the flowchart of FIG. 12, the voltages of the inverting and non-inverting digit lines 76 are established by the sense amplifiers 94, as in the embodiment of FIG. 8 rather than the line driving circuit 104 of FIGS. 10 and 11. Unlike the embodiment of FIG. 8, the word lines 74 are selectively activated so that the cells 72 on the even word lines 74 do not load the sense amplifiers 94.

The test procedure of FIG. 11 is initiated by writing a checkerboard pattern to the array 42 with the [0,0] cell 72 containing a high voltage, in step 1100. Next, in step 1102, the first word line signal WL0 is set high to couple the cells 72 in the first row to the respective non-inverted digit lines 76. In response, the sense amplifiers 94 are triggered to hold the non-inverted digit lines 76 high and the inverted digit lines 76 low, in step 1104. Then, the odd word lines having cells coupled to the complementary digit lines D (e.g., WL1, WL5, WL9, WL13, etc.) are activated in step 1106 to couple the cells 72 to the corresponding complementary digit lines 76. As can be seen from FIG. 11, each of the cells 72 in the activated rows (WL1, WL5, WL9, WL13, etc.) thus contains a low voltage and is coupled to a low complementary digit line 76 such that any charge leakage through stringers 92 will be removed. The first row is thus used as a "seed row" to set the sense amplifier 94 in a desired state before coupling additional cells 72 to the digit lines 76.

The selected word lines are left active for the testing interval of 64 msec in step 1108. At the end of the testing interval, the word lines 74 all return low to isolate the cells from the corresponding digit lines 76 in step 1110. Before reading data, a second pass is initiated in step 1111 and the digit lines 76 are precharged and equilibrated in step 1112. Next, the fourth word line is selected as the seed row at step 1113 and the fourth word line signal WL3 is set high in step 1102. Once again, the sense amplifier 94 is activated (step 1104), every fourth word line following the seed row (i.e., WL7, WL11, WL15, etc.) is activated (step 1106), the testing interval elapses (step 1108), and the word lines return low in step 1110.

After the second pass, the data are read from the memory locations that originally contained data corresponding to high voltages to determine if the data have changed, in step 1114. Next, a check is made in step 1115 to determine if the inverse checkerboard test has been completed. If not, data are written to all of the cells 72 in an inverse checkerboard pattern in step 1116. The previously described two passes are repeated and data is read out in step 1114 to identify defects. After a determination has been made at step 1115 that data have been read out the second time, the test procedure ends in step. 118. As can be seen from the above description, the test procedure of FIG. 12 includes four test intervals of 64 msec for a total time for test periods of 256 msec.

Figure 13:
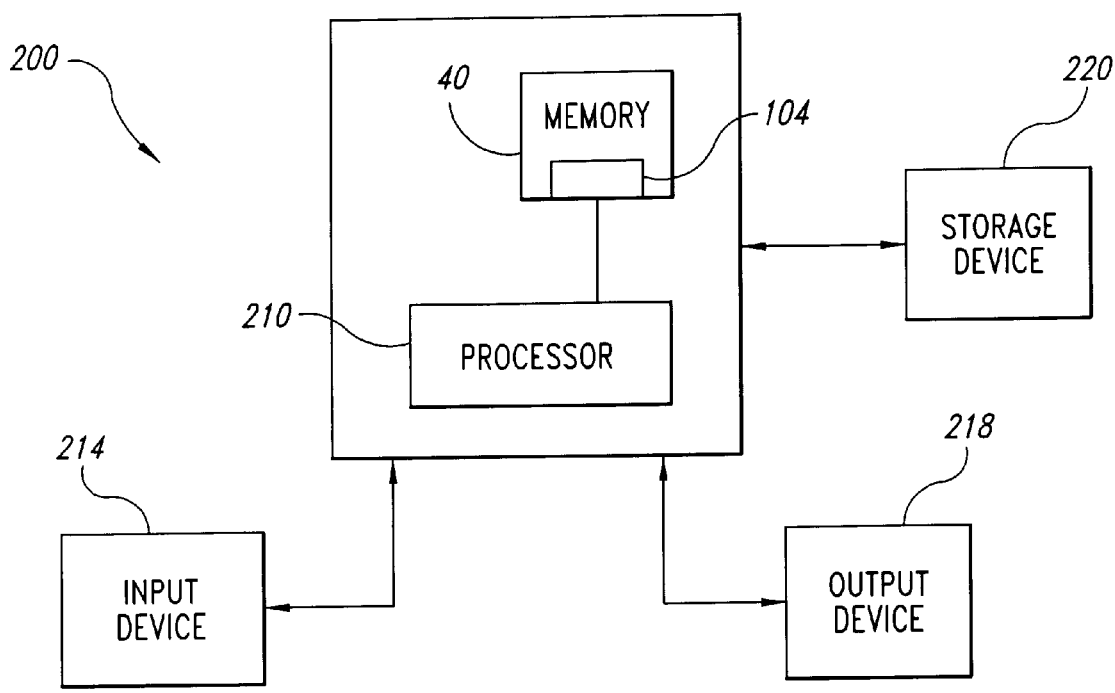
FIG. 13 is a block diagram of a computer system employing a memory device according to the embodiment of FIG. 10.

FIG. 13 is a block diagram of a computer system 200 that uses the memory device 40 including the driving circuit 104 of FIGS. 10 and 11. The computer system 200 includes a processor 210 for performing computer functions, such as executing software to perform desired calculations and tasks. One or more input devices 214, such as a keypad or a mouse, are coupled to the processor 210 and allow an operator (not shown) to manually input data thereto. One or more output devices 218 are coupled to the processor 210 to provide to the operator data generated by the processor 210. Examples of output devices 218 include a printer and a video display unit. One or more mass data storage devices 220 are preferably coupled to the processor 210 to store data in or retrieve data from the storage device 220. Examples of the storage devices 220 include disk drives and compact disk read-only memories (CD-ROMs).

From the foregoing it will be appreciated that, although specific embodiments of the invention have been described herein for purposes of illustration, various modifications may be made without deviating from the spirit and scope of the invention. For example, the driving circuit 104 of FIG. 10 can be used with the test procedures of FIGS. 8 or 12. Similarly, although the sense amplifiers 94 or variable bias circuit 112 of the exemplary embodiments sustain low voltages on selected cells 72 and later data is read from cells 72 that originally were at high voltages, one skilled in the art will understand that the voltages can be reversed. That is, the sense amplifiers 94 or variable bias circuit 112 can maintain a high voltage on selected cells 72 and data can be read from cells 72 that were originally at low voltages. Accordingly, the invention is not limited except as by the appended claims.

What is claimed is:

1. A method of detecting intercell defects in a memory array including a plurality of memory cells coupled to columns of digit lines responsive to rows of word lines, the method compromising:

applying a first voltage to a first digit line in each column of the memory array;

coupling a first set of memory cells to the first digit line in each column of the memory array, thereby placing the first voltage on the memory cells in the first set;

decoupling the first set of memory cells from the first digit line in each column of the memory array;

applying a second voltage to a second digit line in each column of the memory array;

coupling a second set of memory cells to the second digit line in each column of the memory array, thereby placing the second voltage on the memory cells in the second set being coupled to the second digit line during a test interval during which charge may be transferred through an intercell defect between a memory cell in the first set and a memory cells in the second set; and determining the voltage on the memory cells in the first set.

2. A method of detecting intercell defects in a memory array including a plurality of memory cells coupled to columns of digit lines responsive to rows of word lines, the memory array including a sense amplifier coupled to the complimentary digit lines for each column, the method comprising:

energizing the sense amplifier for at least one column of the memory array;

coupling a first set of memory cells to one of the digit lines in the column thereby placing a first voltage on the memory cells in the first set;

decoupling the first set of memory cells from the digit line;

maintaining the sense amplifier energized while coupling at least one memory cell in a second set of memory cells to the other digit line of the column during a test interval, the test interval being of sufficient duration to allow sufficient charge transferred through an intecell defect between a memory cell in the second set and a memory cell in the first set to alter the voltage on the memory cell in the first set from one logic level to another; and determining the voltage on the memory cell in the first set.

3. The method of claim 2 wherein the act of coupling at least on memory cell in a second set of memory cells to the other digit line of the column during a test interval comprises coupling a plurality memory cells in a second set of memory cells to the other digit line of the column.

4. A method of testing a memory array having a plurality of memory cells arranged in rows and columns, the method comprising:

placing a first voltage on a plurality of memory cells in a first set;

coupling a plurality of the memory cells in the first set to each other;

placing a second voltage on a second memory cell that is adjacent to one of the memory cells in the first set, the second voltage being different from the first voltage;

leaving the memory cells in the first set coupled to each other for a period to allow charge to leak from one adjacent memory cell to the other through any intercell defect between the adjacent memory cells, the period being of sufficient duration for the voltage on the second memory cell to change to a voltage that is closer to the first voltage than it is to the second voltage; and determining the voltage on the second memory cell.

5. The method of claim 4, wherein the act of coupling a plurality of the memory cells in the first set to each other comprises coupling a plurality of the memory cells in the first set to each other through a digit line.

6. The method of claim 5, wherein the memory array comprises a plurality of word lines that are activated to couple respective rows of memory cells to a digit line, and wherein the act of coupling a plurality of the memory cells in the first set to each other further comprises simultaneously activating a plurality of the word lines.

7. The method of claim 4, wherein the act of placing a second voltage on a second memory cell comprises writing a bit of data to the second memory cell, and wherein the act of determining the voltage on the second memory cell comprises reading a bit of data from the second memory cell.

8. A method of testing a memory array having a plurality of memory cells arranged in rows and columns, the method comprising:

placing a first voltage on a first memory cell and then isolating the first memory cell from the first voltage;

continuously coupling a second memory cell to a second voltage that is different from the first voltage, the second memory cell being adjacent the first memory cell so that charge can leak from one adjacent memory cell to the other through any intercell defect between the first and second memory cells, the second memory cell being coupled to the second voltage being for a period of sufficient duration for the voltage on the first memory cell to change as a result of the intercell defect to a voltage that is closer to the second voltage than it is to the first voltage; and determining the voltage on the first memory cell.

9. The method of claim 8, wherein the act of continuously coupling the second memory cell to the second voltage comprises:

continuously coupling the second memory cell to a digit line, the digit line being coupled to a sense amplifier; and continuously activating the sense amplifier so that the sense amplifier continuously applies the second voltage to the digit line.

10. The method of claim 9, wherein the memory array includes a plurality of word lines that are activated to couple respective rows of memory cells to the digit line, and wherein the act of continuously coupling the second memory cell to the second voltage further comprises continuously activating the word line for the second memory cell.

11. The method of claim 8, wherein the memory array includes a plurality of complimenary digit line pairs coupled to respective sense amplifiers, and a plurality of word lines that are activated to couple respective rows of memory cells to one of the digit lines, and wherein the acts of placing a first voltage on a first memory cell and then isolating the first memory cell from the first voltage comprise:

activating at least one of the sense amplifiers to place the first voltage on the digit line;

activating one of the word lines to couple the first voltage on the digit line to the first memory cell; and deactivating the word line to isolate the first memory cell from the digit line.

12. A memory device, comprising a memory array having a plurality of memory cells arranged in rows and columns;

a pair of complimentary digit lines for each column of memory cells;

a sense amplifier coupled to each pair of complimentary digit lines;

an access transistor coupled between each memory cell and one of the digit lines for the respective pair of digit lines;

a word line coupled to the access transistors in a respective row, the word line, when activated, causing the access transistors in the respective row to couple a respective memory cell to the digit line to which it is coupled; and a logic controller coupled to the sense amplifiers and the word lines, the logic controller unit being operable to:

place a first voltage on a plurality of memory cells in a first set;

couple a plurality of the memory cells in the first set to each other;

place a second voltage on a second memory cell that is adjacent to one of the memory cells in the first set, the second voltage being different from the first voltage;

leave the memory cells in the first set coupled to each other for a period to allow charge to leak from one adjacent memory cell to the other through any intercell defect between the adjacent memory cells, the period being of sufficient duration for the voltage on the second memory cell to change to a voltage that is closer to the first voltage than it is to the second voltage; and determine the voltage on the second memory cell.

13. The memory device of claim 12, wherein the logic controller is operable to couple a plurality of the memory cells in the first set to each other by coupling a plurality of the memory cells in the first set to each other through one of the digit lines.

14. The memory device of claim 13, wherein the logic controller is operable couple a plurality of the memory cells in the first set to each other further by simultaneously activating a plurality of the word lines.

15. The memory device of claim 12, wherein the logic controller is operable to place a second voltage on a second memory cell by writing a bit of data to the second memory cell, and wherein the logic controller is operable to determine the voltage on the second memory cell by reading a bit of data from the second memory cell.

16. A memory device, comprising a memory array having a plurality of memory cells arranged in rows and columns;

a pair of complimentary digit lines for each column of memory cells;

a sense amplifier coupled to each pair of complimentary digit lines;

an access transistor coupled between each memory cell and one of the digit lines for the respective pair of digit lines;

a word line coupled to the access transistors in a respective row, the word line, when activated, causing the access transistors in the respective row to couple a respective memory cell to the digit line to which it is coupled; and a logic controller coupled to the sense amplifiers and the word lines, the logic controller unit being operable to:

place a first voltage on a first memory cell and then isolate the first memory cell from the first voltage;

continuously couple a second memory cell to a second voltage that is different from the first voltage, the second memory cell being adjacent the first memory cell so that charge can leak from one adjacent memory cell to the other through any intercell defect between the first and second memory cells, the logic controller being operable to couple the second memory cell to the second voltage for a period of sufficient duration for the voltage on the first memory cell to change as a result of the intercell defect to a voltage that is closer to the second voltage than it is to the first voltage; and determine the voltage on the first memory cell.

17. The memory device of claim 16, wherein the logic controller is operable to continuously couple the second memory cell to the second voltage by:

continuously coupling the second memory cell to a digit line, the digit line being coupled to a sense amplifier; and continuously activating the sense amplifier so that the sense amplifier continuously applies the second voltage to the digit line.

18. The memory device of claim 17, wherein the logic controller is operable to continuously couple the second memory cell to the second voltage by continuously activating the word line for the second memory cell.

19. The memory device of claim 16, the logic controller is operable to place a first voltage on a first memory cell and then isolate the first memory cell from the first voltage by:

activating at least one of the sense amplifiers to place the first voltage on the digit line;

activating one of the word lines to couple the first voltage on the digit line to the first memory cell; and deactivating the word line to isolate the first memory cell from the digit line.

* * * * *

UNITED STATES PATENT AND TRADEMARK OFFICE
CERTIFICATE OF CORRECTION

PATENT NO.    : 6,442,719 B1
DATED         : August 27, 2002
INVENTOR(S)   : Ray Beffa and William K. Waller It is certified that error appears in the above-identified patent and that said Letters Patent is hereby corrected as shown below:

Column 1,
Line 9, "filed Jun. 20, 2000." should read -- issued Jun. 20, 2000. --

Column 3,
Line 15, "This process test of intercell defects between only" should read -- This process tests intercell defects between only --

Column 8,
Line 34, "this determination that will" should read -- this determination will --
Line 45, "using the odd that rows," should read -- using the odd rows, --

Column 9,
Line 5, "92, in step 806." should read -- 92 in step 806. --
Line 46, "digit lines 76, from or to," should read -- digit lines 76 from or to --

Column 10,
Line 52, "receives all "Os"" should read -- receives all "0s" --

Column 11,
Line 40, "in step. 118." should read -- in step 1118. --

Column 12,
Line 29, "and a memory cells" should read -- and a memory cell --
Line 36, "complimentary digit" should read -- complementary digit --
Line 57, "least on memory cell" should read -- least one memory cell --

Column 13,
Line 62, "complimentary digit" should read -- complementary digit --

UNITED STATES PATENT AND TRADEMARK OFFICE
CERTIFICATE OF CORRECTION

PATENT NO. : 6,442,719 B1
DATED : August 27, 2002
INVENTOR(S) : Ray Beffa and William K. Waller It is certified that error appears in the above-identified patent and that said Letters Patent is hereby corrected as shown below:

Column 14,
Line 11, "complimentary digit" should read -- complementary digit --
Lines 13, 59 and 61, "pair of complimentary" should read -- pair of complementary --
Line 46, "is operable couple" should read -- is operable to couple --

Signed and Sealed this

Twelfth Day of August, 2003

JAMES E. ROGAN
*Director of the United States Patent and Trademark Office*